United States Patent [19]

Goto

[11] Patent Number: 5,446,395
[45] Date of Patent: Aug. 29, 1995

[54] TEST CIRCUIT FOR LARGE SCALE INTEGRATED CIRCUITS ON A WAFER

[75] Inventor: Junichi Goto, Tokyo, Japan

[73] Assignee: NEC Corporation, Tokyo, Japan

[21] Appl. No.: 124,071

[22] Filed: Sep. 21, 1993

[30] Foreign Application Priority Data

Sep. 22, 1992 [JP] Japan .................................. 4-252608

[51] Int. Cl.6 .......................................... G01R 31/28
[52] U.S. Cl. .................................. 324/763; 324/158.1; 371/22.5
[58] Field of Search ................. 324/158 R, 73.1, 763, 324/158.1; 371/22.5, 22.6

[56] References Cited

U.S. PATENT DOCUMENTS

| | | | |
|---|---|---|---|
| 4,956,602 | 9/1990 | Parrish | 324/158 R |
| 4,961,053 | 10/1990 | Krug | 324/158 R |
| 5,307,010 | 4/1994 | Chiu | 324/158 R |
| 5,315,241 | 5/1994 | Ewers | 324/158 R |

FOREIGN PATENT DOCUMENTS 62-171136  7/1987  Japan .
62-217626  9/1987  Japan .
62-283641 12/1987  Japan .

Primary Examiner—Ernest F. Karlsen
Attorney, Agent, or Firm—Young & Thompson

[57] ABSTRACT

A test circuit for conducting a simultaneous test of a plurality of integrated circuits provided in dicing regions of a wafer. The test circuit has a pattern generator electrically connected to the integrated circuits through first interconnections for generating input signal patterns and subsequent transmission thereof to each of the integrated circuits and pattern compressor/comparator electrically connected to the integrated circuits through second interconnections for analyzing output signals fetched from the integrated circuits so as to conduct a simultaneous test of a plurality of the integrated circuits.

4 Claims, 4 Drawing Sheets

TEST CIRCUIT FOR LARGE SCALE INTEGRATED CIRCUITS ON A WAFER

BACKGROUND OF THE INVENTION

1. Field of the Invention

The invention relates to a test circuit for large scale integrated circuits on a wafer, and more particularly to a test circuit for large scale integrated circuits on a wafer for an improvement in a testability thereof.

2. Description of the Related Art.

The importance of the testability of the large scale integrated circuits on a wafer is on the increase as scaling up of the integrated circuits. Further, improvements in both an efficiency of a wafer test for the large scale integrated circuits and an area usage factor of the wafer are also required for improvements in a high density of the wafer and scaling up of the integrated circuit.

A conventional layout of large scale integrated circuits will be described with reference to FIG. 1. A wafer 10 includes a plurality of pellets or die regions in which large scale integrated circuits (LSI circuits) 20 are provided. The pellets are isolated by scribe lines or dicing lines 100, each of which has a width of approximately 100 micrometers. In the prior art, the wafer test of the every LSI circuits 20 are sequentially conducted by use of an external tester or the like. Since the LSI circuits 20 are electrically separated from each other through the dicing lines 100, the wafer test of the individual LSI circuits 20 is carried out sequentially and independently. The sequential wafer test for every the LSIs 20 results in a low efficiency of the wafer test and in an inferior of the area usage factor of the wafer. This causes a difficulty of the improvement in the testability of the large scale integrated circuits. Accordingly, it is urgently needed to settle the above problems with the testability of the LSI circuits on the wafer.

In the prior art, a simultaneous test of a plurality of the LSI circuits 20, however, requires much time and a large expense which are not practical.

When LSI circuits possess a high speed performance, a performance speed of the tester seems no longer responsive to the high speed performance of the LSI circuits. The test of the LSI circuits on the wafer is carried out by contacting a probe of a tester head with input/output pads of the LSI circuits. This causes a problem with a relatively large contact resistance between the probe of the tester head and the pad of the LSI circuits. Such large contact resistance makes it much more difficult to conduct a high speed test of the LSI circuits.

To settle the problem with the large contact resistance, a built-in self test method has been proposed. In this method, in replacement of the external tester a test circuit is provided on the wafer together with the LSI circuits. The built-in self test method has, however, the following problem. Each of the LSI circuits requires a test circuit, namely, the same number of the test circuits as the number of the LSI circuits are required. This is unsuitable in view of the area usage factor of the wafer and thus not preferable for improvement in the high density of the wafer and the scaling up of the integrated circuits.

In the prior arts, the Japanese laid-open patent application No. 62-171136 discloses another method in which test circuits and LSI circuits are provided on a single wafer but are electrically separate from each other so that any input pad to be contacted with the probe of the tester is separated from each of the LSI circuits as the final products. Such method also has the above problem. Each of the LSI circuits also requires a test circuit, namely the same number of the test circuits as the number of the LSI circuits are required. This is unsuitable in view of the area usage factor of the wafer and thus not preferable for improvement in the high density of the wafer and the scaling up of the integrated circuits.

Alternatively, the Japanese laid-open patent application No. 62-217625 discloses other method in which exclusive power supply lines for the test are provided to supply the power to every block of the LSI circuits on the wafer. The method also has the above problem. Namely, each of the plural LSI circuits requires a test circuit. The same number of the test circuits as the number of the LSI circuits are, therefore, required. This is unsuitable in view of the area usage factor of the wafer and thus not preferable for improvement in the high density of the wafer and the scaling up of the integrated circuits.

Yet another method is disclosed in the Japanese laid-open patent application No. 62-217625. Power supply lines for the test are provided on the scribe lines of the wafer to supply the power to a plurality of the LSI circuits on the wafer so as to conduct a simultaneous test of the plural LSI circuits. The method also has the above problem. Each of the plural LSI circuits requires a test circuit. Accordingly, the same number of the test circuits as the number of the LSI circuits are required. This is unsuitable in view of the area usage factor of the wafer and thus not preferable for improvement in the high density of the wafer and the scaling up of the integrated circuits.

It is, therefore, required to develop a novel test circuit for the LSI circuits which is able to settle the above problems.

SUMMARY OF THE INVENTION

Accordingly, it is a primary object of the present invention to provide a novel test circuit for LIS circuits provided on a wafer.

It is a further object of the present invention to provide a novel test circuit for LSI circuits provided on a wafer, which allows the LSI circuits to have a high testability for the wafer test.

It is a further more object of the present invention to provide a novel test circuit for LSI circuits provided on a wafer, which is able to conduct a simultaneous test of a plurality of the LSI circuits.

It is a still further object of the present invention to provide a novel test circuit for LSI circuits provided on a wafer, which is able to conduct a high speed test of the LSI circuits.

It is yet a further object of the present invention to provide a novel test circuit for LSI circuits provided on a wafer, which allows the wafer to have a high area usage factor.

The above and other objects, features and advantages of the present invention will be apparent from the following descriptions.

The invention provides a test circuit for conducting a simultaneous test of a plurality of integrated circuits provided in dicing regions of a wafer. The test circuit comprises a pattern generator electrically connected to the integrated circuits through first interconnections for generating input signal patterns and subsequent transmission thereof to each of the integrated circuits and pattern compressor/comparator electrically connected to the integrated circuits through second interconnections for analyzing output signals fetched from the integrated circuits so as to conduct a simultaneous test of a plurality of the integrated circuits.

BRIEF DESCRIPTION OF THE DRAWINGS

Preferred embodiments of the present invention will be described in detail with reference to the accompanying drawings.

PREFERRED EMBODIMENTS OF THE INVENTION

The present invention provides a test circuit for LSI circuits on a wafer to realize a high testability for the LSI circuits and a simultaneous and high speed test of a plurality of the LSI circuits as well as a high area usage factor. LSI circuits and test circuits for the LSI circuits are provided on a wafer in which each of the test circuits is electrically connected through interconnections to a plurality of the LSI circuits for a simultaneous test of the plural LSI circuits on the wafer. The test circuit supplies the same input signal pattern through the interconnections to the LSI circuits to be subjected to the test.

The test circuit is fabricated on the basis of the same device and process technologies as those of the LSI circuits. This allows the test circuit to show the same performance speed as that of the LSI circuits thereby a high speed test of the LSI circuits is realized. Since the each test circuit is able to conduct a simultaneous test of a plurality of the LSI circuits, the area usage factor of the wafer is improved.

Each test circuit is provided at the outside of die regions in which the LSI circuits are provided so that the each test circuit is separated from the LSI circuits in the final process.

Figure 1:
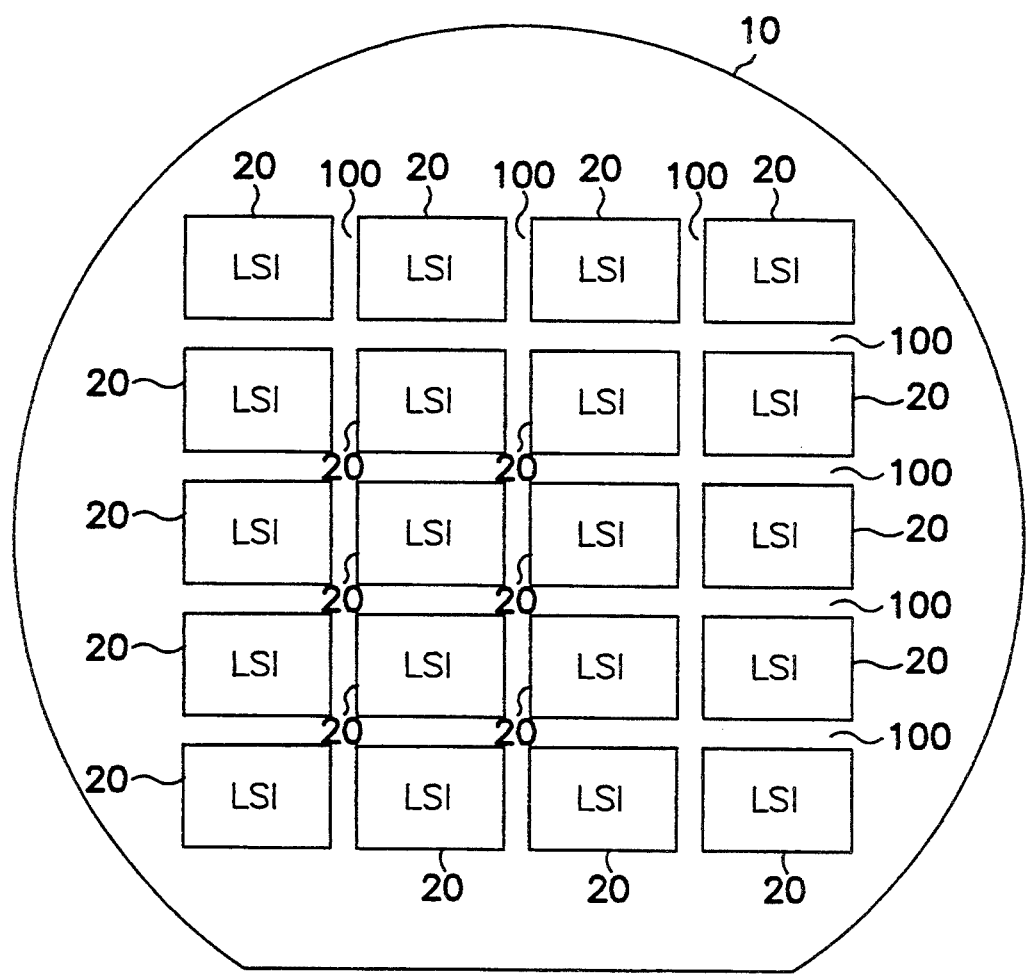
FIG. 1 is a plane view illustrative of a wafer including a plurality of LSI circuits separated by scribe lines in the prior art.
Figure 2:
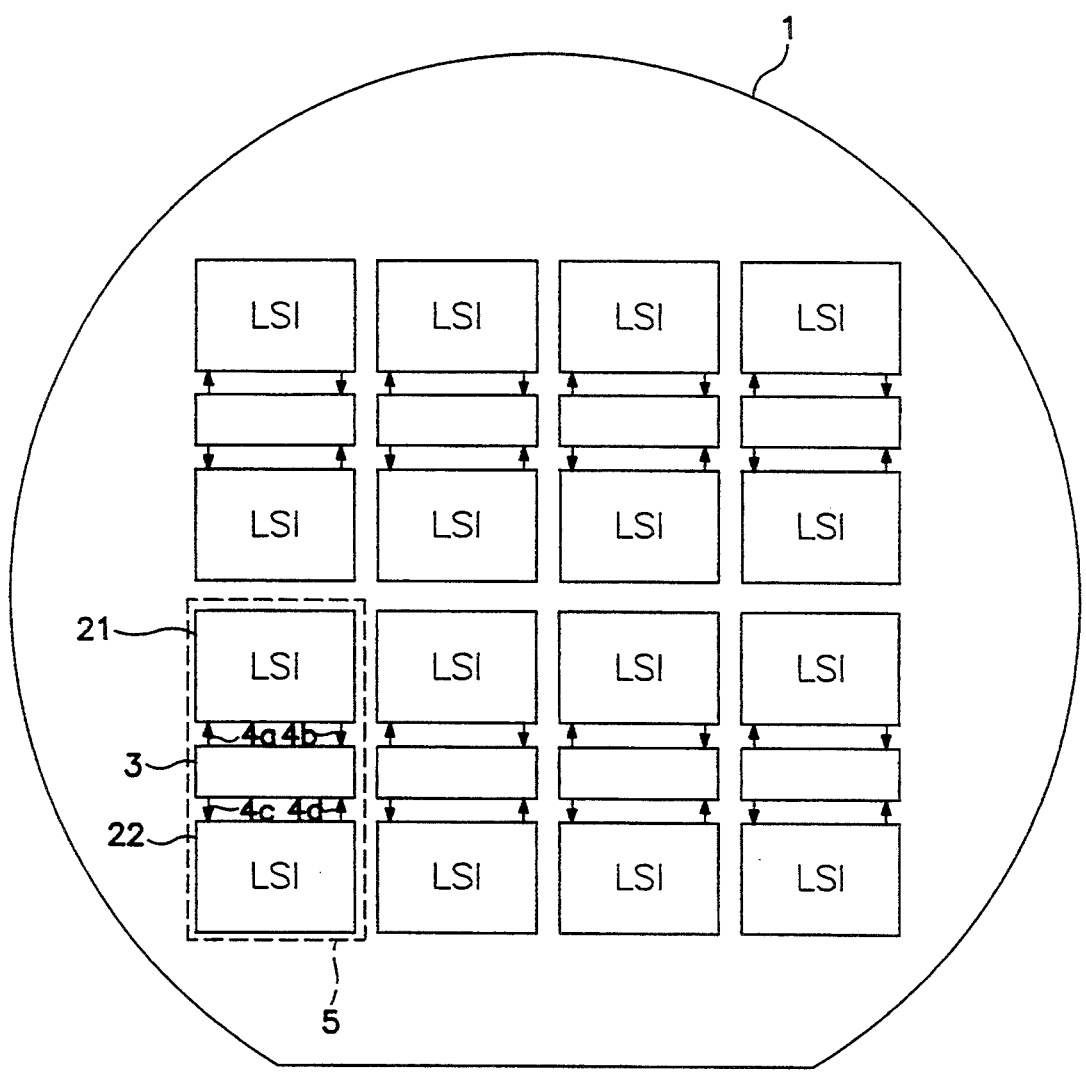
FIG. 2 is a plane view illustrative of a wafer including a plurality of LSI circuits and test circuits separated by scribe lines in an embodiment according to the present invention.
Figure 3:
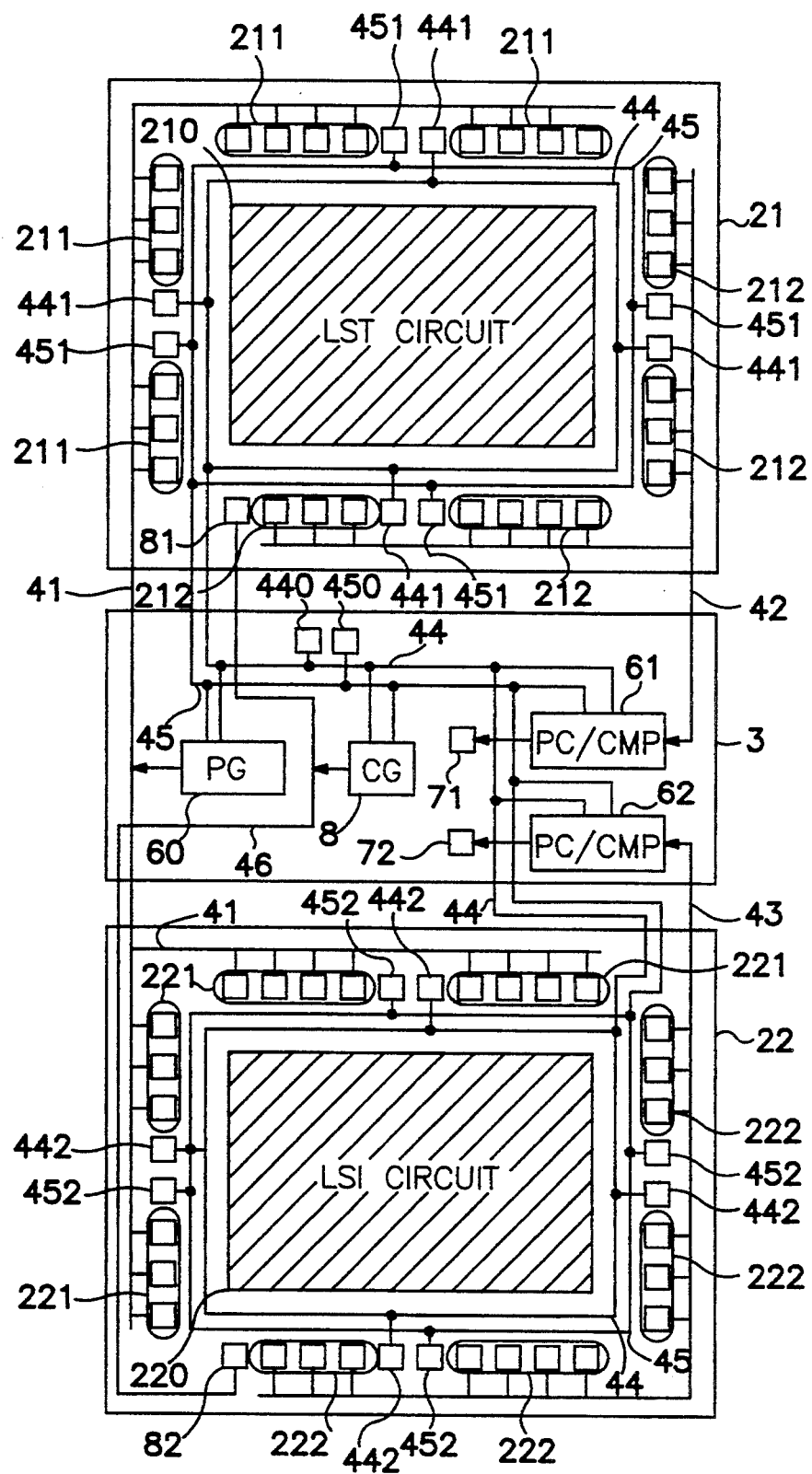
FIG. 3 is a plane view illustrative of a unit comprising a test circuit and two LSI circuits connected to the test circuit, which is provided on a wafer, in an embodiment according to the present invention.

A first embodiment according to the present invention will be described with reference to FIGS. 2 and 3. A wafer 1 includes a plurality of units 5 which comprises two LSI circuits 21 and 22 and a test circuit 3. The units 5 are arranged in die regions defined by the dicing lines. Each of the test circuits 3 is electrically connected through interconnections 4a, 4b, 4c and 4d to the LSI circuits 21 and 22, both of which are provided at opposite sides of the test circuit 3 so that the test circuit 3 conducts a simultaneous test of the LSI circuits 21 and 22.

Each of the units 5 comprising the single test circuit and the LSI circuits 21 and 22 will be described in detail with reference to FIG. 3. Each unit 5 includes the LSI circuits 21 and 22 and the test circuit 3 provided between the LSI circuits 21 and 22. Each of the LSI circuits 21 and 22 comprises a peripheral area including a plurality of pads and a LSI circuit regions. The LSI circuits 21 and 22 have the same function but different layouts of the interconnections. The test circuit 3 has a power supply potential pad 440 and a ground potential pad 450 through which a power necessary for the test is supplied. Both the pads 440 and 450 are electrically connected through power supply interconnections 44 and 45 to each of the LSI circuits 21 and 22. A power supply potential and a ground potential are supplied to each of the LSI circuits 21 and 22 through the pads 440 and 450 and the power supply interconnections 44 and 45 respectively.

The test circuit also has a clock generator 8 which comprises a circuit for generating a clock signal so that the test circuit is able to respond to such a high speed LSI circuits as to which the external LSI tester is unable to respond. The clock generator 8 may comprise a ring oscillator which uses an invertor as an example of the simplest structure. It is, however, required to utilize a clock generator such as a phase locked loop, when a high accuracy clock signal is necessary. The clock generator 8 in the test circuit 3 is connected through a clock signal interconnection 46 to clock signal input pads 81 and 82 which are respectively provided in the LSI circuits 21 and 22. A clock signal generated by the clock generator 8 is transmitted through the clock signal interconnection 46 to the clock signal input pads 81 and 82.

The test circuit has a pattern generator 60 which comprises a circuit for generating input signals to be transmitted to the LSI circuits 21 and 22 respectively. The pattern generator 60 may comprise a pseudo-random number generator utilizing a linear feedback shift register which has widely been used in the built-in self test method. The pattern generator 60 is connected through input signal interconnections 41 to input signal pads 211 and 221 which are provided in the LSI circuits 21 and 22 respectively. Each of the input signal pads 211 and 221 comprises fourteen pads which are separated into four groups. The pattern generator 60 generates the same number of sets comprising the pseudo-random numbers as the number of the input signals for each of the LSI circuits 21 and 22. The generated pseudo-random numbers fare transmitted through the input signal interconnections 41 to the input pads 211 and 221 provided in the LSI circuits 21 and 22 respectively.

The LSI circuits 211 and 221 have output signal pads 212 and 222 respectively. Each of the output signal pads 212 and 222 comprises fourteen pads which are separated into four groups. The output signal pads 212 and 222 are electrically connected through output signal interconnections 42 and 43 to pattern compressor/comparators 61 and 62 respectively. The pattern compressor/comparators 61 and 62 are provided in the test circuit 3 to compress time series of the output signals transmitted from the LSI circuits 21 and 22. The pattern compressor/comparators 61 and 62 compare the results of the compression thereof with expected values obtained by a simulation to confirm the correspondence between the results of the output and the expected values. The pattern compressor/comparators 61 and 62 transmit signals of the results of the comparison to test result output pads 71 and 72 provided in the test circuit 3. The test result output pads 71 and 72 are contacted with probes of test heads of the LSI testers so that the signals of the results of the comparison which appear at the test result output pads 71 and 72 are read out through the probes of the test heads of the LSI testers. Namely, the results of the tests of the LSI circuits 21 and 22 are obtained by use of the single test circuit 3.

Since the LSI circuits 21 and 22 are provided at opposite sides of the test circuit 3, they are asymmetrical with each other. Namely, the interconnections 41, 42, 43, 44, 45 and 46 of the LSI circuits 21 and 22 are also asymmetrical thereby the layouts of the interconnections of the LSI circuits 21 and 22 are different. With respect to fabrication processes of the circuits, a stepper exposure system is usable as having widely been used as exposure systems for the LSI circuits. The stepper exposure system first conducts a unit exposure which engraves a unit pattern on the wafer and then repeats the unit exposure across the surface of the wafer. In this embodiment, the unit 5 including the test circuit 3 and the LSI circuits 21 and 22 may be prepared by the unit exposure of the stepper exposure system.

As described above the test circuit 3 supplies the same input signal to the LSI circuits 21 and 22 and then fetches the outputs of the LSI circuits 21 and 22 to compress the time series of the output signals for subsequent comparisons of the results of the outputs with the expected values thereby the simultaneous test of the plural LSI circuits 21 and 22 is accomplished by the single test circuit 3. According to the present invention, the test circuit 3 for the LSI circuits on the wafer allows the number of times of the test to be reduced to half as compared to that of the prior arts in which the test circuit is required for each LSI circuit. This results in a remarkable improvement in the efficiency of the wafer test and thus the testability of the LSI circuits on the wafer. The number of the test circuits 3 required for all of the LSI circuits on the wafer may be reduced to a half as compared to a separate prior arts in which the test circuit is required for each LSI circuit. This results in a remarkable improvement in the area usage factor of the wafer which allows improvements in a high density of the wafer and scaling up of the LSI circuits thereon.

Figure 4:
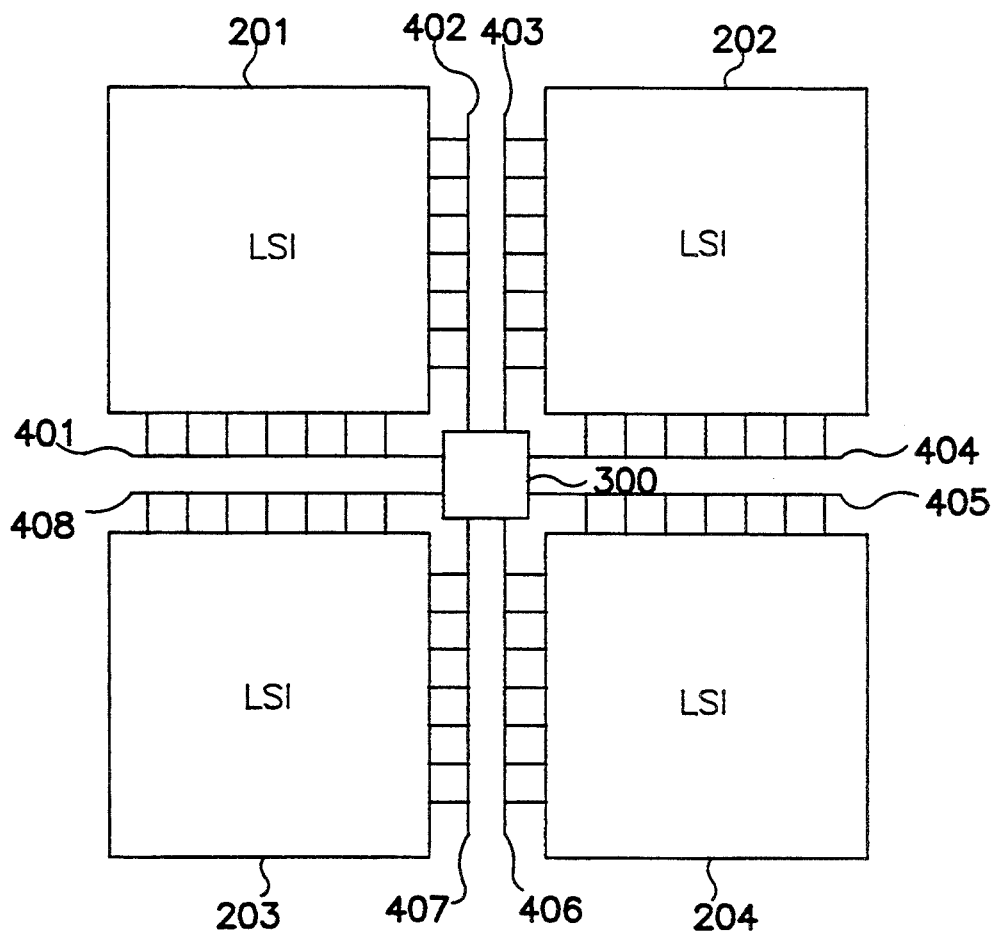
FIG. 4 is a plane view illustrative of an unit of a test circuit and four LSI circuits connected to the test circuit, which is provided on a wafer, in other embodiment according to the present invention.

A second embodiment according to the present invention will be described with reference to FIG. 4. A wafer includes a plurality of units which comprises four LSI circuits 201, 202, 203 and 204 and a test circuit 300. The units are arranged in die regions defined by the dicing lines. Each of the test circuits 300 is electrically connected through interconnections 401 to 408 to the LSI circuits 201, 202, 203 and 204. The test circuit 300 is provided at an intersection point of dicing lines which separate the LSI circuits 201, 202, 203 and 204 so that the test circuit 300 supplies the same input signal to the four LSI circuits through the interconnections and then fetches output signals from the respective LSI circuits through the interconnections. The circuit configuration and function of the test circuit 300 are almost the same as those of the first embodiment. Namely, the test circuit 3 supplies the same input signal to the LSI circuits and then fetches the outputs of the LSI circuits to compress the time series of the output signals for subsequent comparisons of the results of the outputs with expected values thereby the simultaneous test of the four LSI circuits is accomplished by only the single test circuit 300. According to the present invention, the test circuit 300 for the LSI circuits on the wafer allows the number of times of the test to be reduced to a quater as compared to that of the prior arts in which a separate test circuit is required for each LSI circuit. This results in a remarkable improvement in the efficiency of the wafer test and thus the testability of the LSI circuits on the wafer. The number of the test circuits required for all of the LSI circuits on the wafer may be reduced to a quater as compared to the prior arts in which the test circuit is required for each LSI circuit. This results in a remarkable improvement in the area usage factor of the wafer which allows improvements in a high density of the wafer and scaling up of the LSI circuits thereon.

Alternatively, it is possible that a single test circuit is connected to all of LSI circuits provided on a wafer by an exposure of a direct electron beam. In this case, the single test circuit is able to conduct a simultaneous test of all of the LSI circuits on the wafer. Namely, the test circuit 3 supplies the same input signal to all of the LSI circuits and then fetches the outputs of the all LSI circuits to compress the time series of the output signals for subsequent comparisons of the results of the outputs with expected values thereby the simultaneous test of the all LSI circuits is accomplished by only the single test circuit. According to the present invention, the test circuit for the all LSI circuits on the wafer allows the number of times of the test to be reduced as compared to that of the prior arts in which the test circuit is required for each LSI circuit. This results in a remarkable improvement in the efficiency of the wafer test and thus the testability of the LSI circuits on the wafer. The number of the test circuits required for all of the LSI circuits on the wafer may be reduced as compared to the prior arts in which a separate test circuit is required for each LSI circuit. This results in a remarkable improvement in the area usage factor of the wafer which allows improvements in a high density of the wafer and scaling up of the LSI circuits thereon.

Whereas modifications of the present invention will no doubt be apparent to a person having ordinary skill in the art, to which the invention pertains, it is to be understood that the embodiments shown and described by way of illustrations are by no means intended to be considered in a limiting sense. Accordingly, it is to be intended to cover by claims all modifications of the invention which fall within the sprit and scope of the invention.

What is claimed is :

1. A circuit for simultaneously testing at least two of a plurality of integrated circuits provided in dicing regions of a wafer comprising:

an input test signal generating and transmitting means electrically connected to at least two of said plurality of integrated circuits through first interconnection means for generating input test signal patterns and for subsequently transmitting said input test signal patterns to each of said at least two integrated circuits; and output test signal analyzing means directly electrically connected to each of said at least two integrated circuits through second interconnection means for analyzing output test signals output from each of said at least two integrated circuits in response to said input test signal patterns so as to conduct a test of each of said at least two integrated circuits simultaneously, a number of said analyzing means being equal to a number of integrated circuits to be simultaneously tested.

2. The circuit as claimed in claim 1, wherein said test circuit is provided outside said dicing regions in which said integrated circuits are provided.

3. The circuit as claimed in claim 1, further comprising clock signal generating and transmission means connected to said at least two integrated circuits through third interconnections means for generating clock signals and for subsequently transmitting said clock signals to each of said at least two integrated circuits.

4. The circuit as claimed in claim 1, wherein said analyzing means comprise means for compressing a time series of said output signal patterns output from each of said at least two integrated circuits and means for comparing said compressed signals with expected values to determine whether said compressed signals and said expected values match.

* * * * *